(12) United States Patent
Kim et al.

(10) Patent No.: US 10,255,392 B2
(45) Date of Patent: Apr. 9, 2019

(54) SUBSTRUCTURE GENERATION USING AUTOMATED MULTILEVEL SUBSTRUCTURING

(75) Inventors: Mintae Kim, Warwick, RI (US); Vladimir Belsky, Mansfield, MA (US); Mikhail Belyi, Easton, MA (US)

(73) Assignee: Dassault Systemes Simulia Corp., Johnston, RI (US)

( * ) Notice: Subject to any disclaimer, the term of this patent is extended or adjusted under 35 U.S.C. 154(b) by 1023 days.

(21) Appl. No.: 13/296,027

(22) Filed: Nov. 14, 2011

(65) Prior Publication Data

US 2013/0124150 A1    May 16, 2013

(51) Int. Cl.
G06F 17/50     (2006.01)

(52) U.S. Cl.
CPC ...... *G06F 17/5018* (2013.01); *G06F 17/5095* (2013.01)

(58) Field of Classification Search
None
See application file for complete search history.

(56) References Cited

U.S. PATENT DOCUMENTS

| | | | |
|---|---|---|---|
| 5,686,667 A | 11/1997 | McCollum et al. | |
| 7,542,887 B2 | 6/2009 | Brughmans et al. | |
| 2004/0194051 A1 | 9/2004 | Croft | |
| 2006/0259283 A1* | 11/2006 | Brughmans et al. | 703/2 |

FOREIGN PATENT DOCUMENTS

JP     2006-313400 A    11/2006

OTHER PUBLICATIONS

M. Kim, "An efficient eigensolution method and its implementation for large structural systems," Ph.D. dissertation, University of Texas at Austin, Austin, TX, May 2004.*

Majed, A. and Henkel, E. E., and Wilson, C. "Improved Mixed-Boundary Component Mode Representation for Structural Dynamic Analysis," MSC Software Virtual Product Development Conference, Paper MSC-VPD-2004-65, Huntington Beach, CA, Oct. 2004.*

(Continued)

*Primary Examiner* — Kibrom K Gebresilassie
*Assistant Examiner* — Robert S Brock
(74) *Attorney, Agent, or Firm* — Hamilton, Brook, Smith & Reynolds, P.C.

(57) ABSTRACT

A computer-implemented method is provided for use in finite element analysis of a three-dimensional (3D) representation of a physical object. The computer-implemented method includes combining a plurality of retained degrees of freedom of the 3D representation to form a root substructure, reducing a structure of the 3D representation on to a reduced automated multilevel substructuring (AMLS) subspace, and computing a plurality of eigenmodes and condensed operators based on the reduced structure, and computing constraint modes using an AMLS transformation matrix. The computer-implemented method also includes generating at least one substructure of the 3D representation based on the plurality of eigenmodes, constraint modes, and condensed operators, and storing the at least one substructure in a memory area.

25 Claims, 7 Drawing Sheets

(56) References Cited

OTHER PUBLICATIONS

K. Elssel and H. Voss. An a priori bound for automated multilevel substructuring. 2004. To appear in SIAM J.Matr.Anal.Appl, 16 pages.*

Alexander M. Belostotsky, Pavel .A. Akimov, Alexey L. Potapenko, Vladislav V. Vershinin, Sergey V. Scherbina, "Dynamic Substructures Synthesis Methods for NPP Systems "Foundation—Structure—Equipment—Pipelines" Analysis", International Journal for Computational Civil and Structural Engineering, 9(4) 15-22 (2013).*

Vladimir Belsky et al, Accelerating Commercial Linear Dynamic and Nonlinear Implicit FEA Software Through High Performance Computing, Dassault Systemes Simulia Corp., (2010), 12 pages.*

Belyi, M. et al, Advanced Linear Dynamic Capabilities and Modeling Abstractions in Abaqus , RASD 2013, 11 International Conference Jul. 1-3, 2013 Pisa, 15 pages.*

J.K. Benninghof, R.B. Lehoucq, An automated multilevel substructuring method for eigenspace computations in linear elastodynamics, SIAM J. Sci. Comput. 25 (2004) 2084-2106.*

J. K. Bennighof and M. F. Kaplan, M. B. Muller, and M. Kim, "Meeting the NVH Computational Challenge: Automated Multilevel Substructuring ," Proceedings of the 18st International Modal Analysis Conference, San Antonio, Texas, Feb. 2000, 7 pages.*

Haben, Joshua D., A versatile parallel Lanczos eigensolver solution for MPI compatible AMLS, Thesis, The University of Texas at Austin, 2009, 135 pages.*

Sven Niels Voormeeren, Dynamic Substructuring Methodologies for Integrated Dynamic Analysis of Wind Turbines, PhD Thesis, Technische Universiteit Delf, 2012, 304 pages.*

Bennighof JK, Kaplan MF, Muller MB, Frequency response analysis using adaptive multi-level substructuring, In Anon, editor, Proceedings of the International Modal Analysis Conference—IMAC, vol. 1, SEM, 1997, p. 64-70.*

Bennighof JK, Kaplan MF, Muller MB, Reducing NVH analysis burden using Automated Multi-Level Substructuring, In Anon, editor, Proceedings of the International Modal Analysis Conference—IMAC, vol. 1, SEM, 1999, p. 372-377.*

M. F. Kaplan, "Implementation of Automated Multilevel Substructuring for Frequency Response Analysis of Structures," Ph.D Dissertation, University of Texas at Austin, Texas, 2001.*

Authors Unknown, Abaqus 6.9 manual entry regarding substructuring, obtained from http://abaqusdoc.ucalgary.ca/v6.9/books/stm/default.htm on Apr. 4, 2017, 4 pages.*

Authors Unknown, Abaqus 6.9 manual entry regarding retained degrees of freedom, obtained from http://abaqusdoc.ucalgary.ca/v6.9/books/usb/default.htm?startat=pt04ch10s01aus52.html on Apr. 4, 2017, 2 pages.*

Madhujit Mukhopadhyay, p. 226 of Vibrations, Dynamics and Structural Systems 2nd edition, 2000, Obtained from https://books.google.com/books?id=SeC8hvl2QywC&pg=PA226&lpg=PA226&dq=%22retained+degrees+of+freedom%22&source=bl&ots=QrOeuYUS6c&sig=oz3Qg5OUfwh44gFekBLYaK9Cn58&hl=en&sa=X&ved=0ahUKEwjpyqf-ulvTAhXFyyYKHSyaBS4Q6AElljAB#v=onepage&q=%22retained%2.*

Komzsik, L., "What Every Engineer Should Know About Computational Techniques of Finite Element Analysis, Second Edition", Chapters 11 and 12, CRC Press, 2009.

"PERMAS: Short Description Version 12," INTES GmbH Manual, p. 1-72 (Apr. 2008).

Elssel, K., and Voss, H., "An a Priori Bound for Eigenvalue Computation by AMLS," Proceedings in Applied Mathematics and Mechanics, 6: 715-716 (2006).

Murthy, P., et al., "Automated Component Modal Synthesis With Parallel Processing," 2nd Worldwide Automotive Conference Papers, MSC Software, p. 1-9.

"SMS—A High Performance Eigenvalue Solver," Vanderplaats Research & Development, Inc., 2 pages (Jun. 2001).

"CDH AG—Welcome to the world of virtual engineering—What is CDH/AMLS?," Downloaded from Internet at http://www.cdh-ag.com/de/cdh-software.html on Jul. 22, 2011, 2 pages.

Elssel, K., and Voss, H., "Solving nonlinear eigenproblems by AMLS," Proceedings in Applied Mathematics and Mechanics, 5: 765-766 (2005).

Beisheim, J., "Introducing the Supernode Eigensolver," ANSYS Advantage, 3(1): 23-24 (2009).

"Creating Superelements," HyperWorks 11 User Guide, RADIOSS, MotionSolve, and OptiStruct (Apr. 21, 2011).

Gao, W., et al., "An Implementation and Evaulation of the AMLS Method for Sparse Eigenvalue Problems," ACM Transactions on Mathematical Software, 34(4)(20) (Jul. 2008).

European Search Report, EP 12192486, "Substructure Generation Using Automated Multilevel Substructuring," date of completion Apr. 17, 2013.

Ragnarsson, P., et al., "Fast approximation of synthesized frequency response functions with automated multi-level substructuring (AMLS)," Finite Elements in Analysis and Design, 47(2): 195-199 (Feb. 2011).

Blomeling, F., "Multi-level substructuring combined with model order reduction methods," Linear Algebra and its Applications, 436(10): 3864-3882 (2012).

Elssel, K. and Voss, H., "Reducing sparse nonlinear eigenproblems by automated multi-level substructuring," Advances in Engineering Software, 39(10): 828-838 (Oct. 2008).

de Klerk, D., et al., "General Framework for Dynamic Substructuring: History, Review, and Classification of Techniques," AIAA Journal May 2008 American Institute of Aeronautics and Astronautics Inc. US, 46(5): 1169-1181, (2008).

* cited by examiner

SUBSTRUCTURE GENERATION USING AUTOMATED MULTILEVEL SUBSTRUCTURING

BACKGROUND OF THE INVENTION

The embodiments described herein relate generally to finite element analysis and, more particularly, to finite element analysis (FEA) simulation of structures having a large number of degrees of freedom.

Substructuring techniques (or Component Mode Synthesis) are commonly employed in the finite element framework for analyzing large, complex structural systems. These techniques make local design modifications easier and accelerate model assembly process. Especially in the design stage of large vehicle models, substructuring techniques are frequently used to reduce the size of assembled systems and, consequently, the cost of subsequent analyses with the assembled system. To reduce the size of a large system using substructuring techniques, truncated normal modes are commonly used in addition to the constraint (sometimes also referred to as static) modes. To satisfy the increased accuracy requirement for the finite element models at higher frequencies, the model system size grows significantly and many substructure eigenmodes are required.

One known method of solving large-scale eigenvalue problems is the automated multilevel substructuring (AMLS) technique. The AMLS technique is also used to speed up the eigensolution process for large substructure generation. However, generating substructures, which includes projecting the substructure system matrices on to the substructure modal space that includes eigenmodes and constraint modes, takes significant computational time and requires a huge amount of computer resources because the full substructure modes for a large substructure need to be stored for recovery later and retrieved for the condensed matrix computation in the substructure generation process. Within a conventional dynamic substructure generation procedure for large-scale models, computing eigenmodes is mandatory and the costs of computing constraint modes and projecting system matrices (i.e., stiffness, mass, damping matrices, and force vectors) onto substructure modal space are very high because the projection is performed using full substructure modes in the physical space, the size of which can easily be more than tens of millions degrees of freedom.

BRIEF DESCRIPTION OF THE INVENTION

In one aspect, a computer-implemented method is provided for use in finite element analysis of a three-dimensional (3D) representation of a physical object. The computer-implemented method includes, in the AMLS method, combining a plurality of retained degrees of freedom of the 3D representation to form a root substructure, projecting a structure of the 3D representation on to AMLS substructure modal subspaces in the multiple levels (or reduced AMLS subspace), computing a plurality of eigenmodes and condensed operators on the reduced AMLS subspace, and computing substructure constraint modes using the AMLS transformation matrix. The computer-implemented method also includes generating at least one substructure of the 3D representation based on the plurality of eigenmodes, constraint modes, and condensed operators, and storing the at least one substructure in a memory area.

In another aspect, a computer is provided for use in finite element analysis of a three-dimensional (3D) representation of a physical object. The computer includes a memory area and a processor operatively coupled to the memory area. The processor is configured to utilize AMLS technology to combine a plurality of retained degrees of freedom of the 3D representation to form a root substructure, project a structure of the 3D representation on to substructure modal subspace in multiple levels, compute a plurality of eigenmodes and condensed operators based on the reduced structure, and compute constraint modes using the AMLS transformation matrix. The processor is also configured to generate at least one substructure of the 3D representation based on the plurality of eigenmodes, constraint modes, and condensed operators, and to store the at least one substructure in the memory area.

In another aspect, a computer program product is provided for use in finite element analysis of a three-dimensional (3D) representation of a physical object. The computer program product includes one or more computer-readable storage media having computer-executable components, wherein the components include a root substructure generation component that when executed by a processor causes the processor to combine a plurality of retained degrees of freedom of the 3D representation to form a root substructure. The components also include a substructure generation component that when executed by a processor causes the processor to reduce a structure of the 3D representation on to substructure modal subspaces (or the reduced AMLS subspace), compute a plurality of eigenmodes and condensed operators based on the reduced structure, and to compute constraint modes using the AMLS transformation matrix. The substructure generation component also causes the processor to generate at least one substructure of the 3D representation based on the plurality of eigenmodes, constraint modes, and condensed operators.

BRIEF DESCRIPTION OF THE DRAWINGS

The details of one or more embodiments of the invention are set forth in the accompanying drawings and the description that follows. Other features, objects, and advantages of the invention will be apparent from the description and drawings, and from the claims.

DETAILED DESCRIPTION OF THE INVENTION

Figure 1:
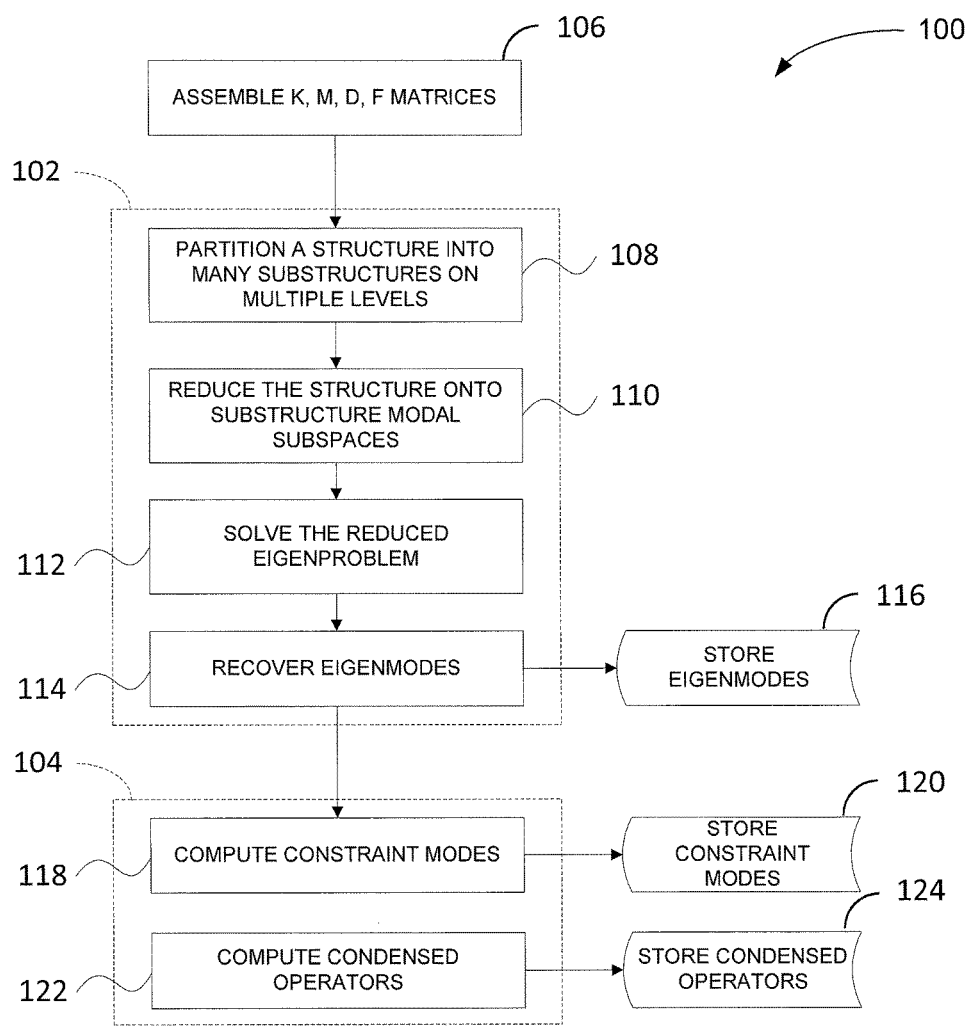
FIG. 1 is a flowchart that illustrates a known process that includes an AMLS technique for computing eigenmodes and a known Craig-Bampton, or fixed-interface, substructure generation technique.

As used herein, the terms Craig-Bampton and Craig-Bampton process, procedure, and/or method relate generally to a substructuring method that uses constraint modes and fixed-interface dynamic modes, which include eigenmodes and/or residual modes.

As used herein, the terms Craig-Chang and Craig-Chang process, procedure, and/or method refer generally to a substructuring method that uses constraint modes and free-interface dynamic modes, which include modified eigenmodes and/or residual modes. The Craig-Chang method uses an orthogonalization process to remove possible linear-dependency of the dynamic modes and to modify the dynamic modes to the same structure as it is in the fixed-interface method (however, without altering the subspace).

As used herein, the terms general mixed-interface process, procedure, and/or method refer generally to a substructuring method that uses general dynamic modes which may include eigenmodes with arbitrary boundary conditions at the substructure interface and/or any other dynamic modes. Both Craig-Bampton and Craig-Chang methods are subsets of this general approach.

Exemplary embodiments of methods, systems, apparatuses, and computer program products for use in finite element analysis (FEA) of three-dimensional (3D) representations of physical objects are described herein. The embodiments described herein facilitate integrating the AMLS eigensolution procedure with substructure generation process to address drawbacks of the current substructure generation procedure. Moreover, using embodiments described herein, substructure normal modes and constraint modes, and condensed substructure system matrices are computed during the AMLS eigensolution process with very little additional computational costs. Accordingly, the embodiments described herein significantly enhance the performance of substructure generation process, and reduces the computational resource usage by eliminating requirement of the use and computation of full substructure modes (including eigenmodes and constraint modes).

Exemplary technical effects of the methods, systems, apparatuses, and computer programs described herein include a new AMLS-based substructure generation algorithm. Fixed-interface, free-interface, and mixed-interface substructures can be generated within the AMLS eigensolution procedure. In the conventional substructure generation methods, the constraint modes are computed by factoring the stiffness matrix for eliminated degrees of freedom (DOFs) and solving the system of linear equations with the coupling stiffness terms between the eliminated and retained DOFs as right-hand side vectors in this system. Then, using the full eigenmodes and the constraint modes, the condensed system matrices are computed. Because the stiffness matrix is factored during the AMLS transformation, the factored stiffness matrix can be reused to compute the constraint modes in the AMLS eigensolution process. This will save one factorization of the stiffness matrix in the substructure generation process. Also, the condensed system matrices are the system matrices of the retained substructure if the retained substructure is defined as a root substructure. This means that the diagonal blocks of the condensed matrices are computed as a part of AMLS transformation process and so there are no extra costs of computing diagonal blocks of the condensed stiffness and mass matrices for substructure generation. Furthermore, the off-diagonal blocks of the condensed mass and damping matrices that require full eigenmodes can be computed on the reduced AMLS subspace with few computation costs since the size of the reduced AMLS subspace is typically two orders of magnitudes smaller than the original size of the structure. Therefore, the computations in the substructure generation process are completely eliminated. In addition, as described herein with respect to exemplary embodiments of the invention, the full eigenmodes are not necessarily computed for substructure generation since they are not required except for substructure full recovery. So, if the selective recovery is requested in the substructure generation process, only selective recovery of eigenmodes at the user-defined nodes can be requested to save the times to recover the full eigenmodes in the AMLS eigensolution process and remove the secondary disk space requirement for storing a large, full eigenmodes for the subsequent substructure generation process. For the Craig-Chang method, the necessary orthogonalization of the modified dynamic modes can be done efficiently on the reduced AMLS subspace, which will significantly reduce the computational demands.

FIG. 1 is a flowchart 100 that illustrates a known process that includes an AMLS technique 102 for computing eigenmodes and a well-known Craig-Bampton, or fixed-interface, substructure generation technique 104. In the known process, system matrices are assembled 106 for a 3D representation or model of a physical object, including stiffness matrices, mass matrices, damping matrices, and/or force vector matrices. For example, the stiffness matrices (K) and mass matrices M are partitioned as shown in Equations (1) and (2):

$$K = \begin{pmatrix} K_{ee} & K_{er} \\ K_{er}^T & K_{rr} \end{pmatrix} \quad \text{Eq. (1)}$$

$$M = \begin{pmatrix} M_{ee} & M_{er} \\ M_{er}^T & M_{rr} \end{pmatrix} \quad \text{Eq. (2)}$$

Here, subscript e indicates eliminated degrees of freedom and subscript r indicates retained degrees of freedom for a substructure. For this system, the Craig-Bampton transformation matrix can be written as shown in Equation (3):

$$\begin{Bmatrix} u_e \\ u_r \end{Bmatrix} = \begin{pmatrix} \Phi_e & \Psi_{er} \\ 0 & I_r \end{pmatrix} \begin{Bmatrix} \eta_e \\ u_r \end{Bmatrix} = [\Phi \ \Psi] \begin{Bmatrix} \eta_e \\ u_r \end{Bmatrix} = T_{CB} \begin{Bmatrix} \eta_e \\ u_r \end{Bmatrix} \quad \text{Eq. (3)}$$

where $\Psi_{er} = -K_{ee}^{-1} K_{er}$.

The condensed (or projected) stiffness (K) and mass (M) matrices using the Craig-Bampton transformation matrix can be written as shown in Equations (4) through (8):

$$\hat{K} = T_{CB}^T K \, T_{CB} = \begin{pmatrix} \Lambda_{aa} & 0 \\ 0 & \hat{K}_{rr} \end{pmatrix} \quad \text{Eq. (4)}$$

$$\hat{M} = T_{CB}^T M \, T_{CB} = \begin{pmatrix} I_{aa} & \hat{M}_{ar} \\ \hat{M}_{ar}^T & \hat{M}_{rr} \end{pmatrix} \quad \text{Eq. (5)}$$

where $$\hat{K}_{rr} = K_{rr} - K_{er}^T K_{ee}^{-1} K_{er} = K_{rr} + K_{er}^T \Psi_{er} \quad \text{Eq. (6)}$$

$$\hat{M}_{rr} = M_{rr} + \Psi_{er}^T (M_{ee}\Psi_{er} + M_{er}) + M_{er}^T \Psi_{er} \quad \text{Eq. (7)}$$

$$\hat{M}_{\alpha r} = \Phi_e^T (M_{ee}\Psi_{er} + M_{er}) \quad \text{Eq. (8)}$$

Here, $\Lambda_{\alpha\alpha}$ denotes the diagonal matrix with eigenvalues on the diagonal and $\alpha$ indicates modal degrees of freedom of the substructure.

Similarly, the condensed damping matrix can be formed as shown in Equations (9) through (12):

$$\hat{D} = T_{CB}^T D T_{CB} = \begin{pmatrix} \hat{D}_{\alpha\alpha} & \hat{D}_{\alpha r} \\ \hat{D}_{\alpha r}^T & \hat{D}_{rr} \end{pmatrix} \quad \text{Eq. (9)}$$

where $$\hat{D}_{\alpha\alpha} = \Phi_e^T D_{ee} \Phi_e \quad \text{Eq. (10)}$$

$$\hat{D}_{rr} = D_{rr} + \Psi_{er}^T (D_{ee}\Psi_{er} + D_{er}) + D_{er}^T \Psi_{er} \quad \text{Eq. (11)}$$

$$\hat{D}_{\alpha r} = \Phi_e^T (D_{ee}\Psi_{er} + D_{er}) \quad \text{Eq. (12)}$$

In addition, a condensed (or projected) force vectors matrix can be written as shown in Equation (13):

$$\hat{F} = \begin{Bmatrix} \hat{F}_\alpha \\ \hat{F}_r \end{Bmatrix} = \begin{pmatrix} \Phi_e & \Psi_{er} \\ 0 & I_r \end{pmatrix}^T \begin{Bmatrix} F_e \\ F_r \end{Bmatrix} = \begin{Bmatrix} \Phi_e^T F_e \\ \Psi_{er}^T F_e + F_r \end{Bmatrix} \quad \text{Eq. (13)}$$

A goal of substructure generation procedure is to generate substructure modes (eigenmodes ($\Phi$)+constraint modes ($\Psi$)) and condensed substructure system matrices: $\hat{K}$, $\hat{M}$, $\hat{D}$, and $\hat{F}$.

Accordingly, in the AMLS procedure 102, a structure is partitioned 108 into a plurality of substructures on multiple levels, and the structure is then reduced 110 onto substructures modal subspaces. The resulting eigenproblem is solved 112 to compute the reduced eigenmodes and then the global eigenmodes are recovered 114 and stored 116 in a memory area.

In the Craig-Bampton procedure 104, firstly constraint modes are computed 118 and stored 120 in a memory area, then one or more substructures are generated by computing 122 condensed substructure operators, which are then stored 124 in a memory area.

There are known disadvantages of using the above-described process. For example, this known process takes significant computational time and requires a huge amount of computer resources because the full substructure modes for a large substructure need to be stored for recovery later and retrieved for the condensed matrix computation in the substructure generation process. Within a conventional dynamic substructure generation procedure for large-scale models, computing eigenmodes is mandatory and the costs of computing constraint modes and projecting system matrices onto Craig-Bampton subspace (eigenmodes and constraint modes) are very high because the projection is performed using full substructure eigenmodes and constraint modes in the physical space, the size of which can easily be more than tens of millions degrees of freedom. This requires large data storage areas and uses increasingly large amounts of time to transfer portions of the data from one memory area, such as a hard disk, to another memory area, such as operating memory.

Figure 2:
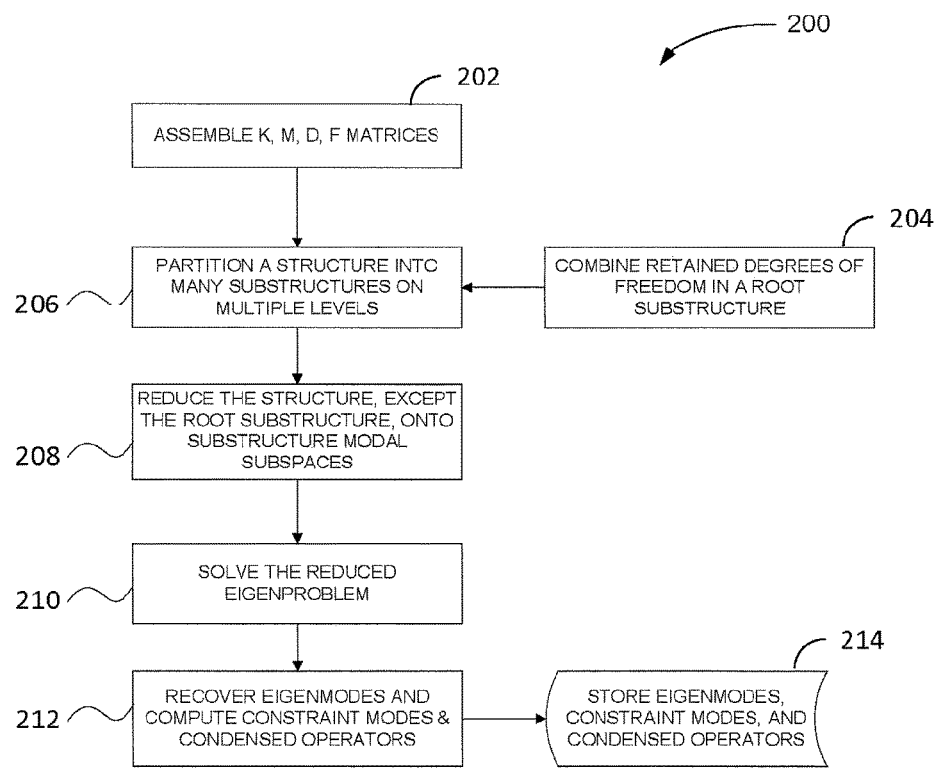
FIG. 2 is a flowchart that illustrates an exemplary method that includes an AMLS-based Craig-Bampton process for use in finite element analysis (FEA) of three-dimensional (3D) representations of physical objects.

FIG. 2 is a flowchart 200 illustrating an exemplary method that integrates an AMLS-based process and a Craig-Bampton process for use in FEA of 3D representations of physical objects. In an exemplary embodiment, system matrices are assembled 202 for a 3D representation or model of a physical object, including stiffness matrices, mass matrices, damping matrices, and/or force vector matrices, as described above with respect to FIG. 1.

Moreover, a root substructure eigenproblem is solved in the AMLS process to make a transformed stiffness matrix completely diagonal. Accordingly, for a root substructure that is defined to have only retained degrees of freedom, an exemplary embodiment no longer requires computing a solution to the root substructure eigenproblem and the reduction process with the root substructure eigenmodes. Therefore, condensed system matrices can be generated on the Craig-Bampton subspace using byproducts created during the AMLS eigensolution process.

In an exemplary embodiment, the global eigenmodes computed by the AMLS process are expressed in terms of the AMLS transformation matrix. The eigenmodes computed using the AMLS process can be expressed as shown in Equation (14):

$$\Phi_e = T_A \Phi_A \quad \text{Eq. (14)}$$

where $T_A$ is an AMLS transformation matrix and $\Phi_A$ is a matrix representing the reduced eigenmodes computed in the AMLS substructure modal space. Because the Craig-Bampton transformation matrix can be split into two components, this AMLS transformation matrix can be naturally separated into two parts: substructure constraint modes and substructure fixed-interface eigenmodes as shown in Equation (15):

$$T_A [\Pi_{i=1}^n \Psi_s^{(i)} \Phi_s^{(i)}] = [\Pi_{i=1}^n \Psi_s^{(i)}][\Pi_{i=1}^n \Phi_s^{(i)}] = \hat{\Psi}_s \Phi_s \quad \text{Eq. (15)}$$

where n is the number of substructures, $\Psi_s^{(i)}$ is a constraint mode matrix of substructure i, and $\Phi_s^{(i)}$ is an block-diagonal matrix with identity matrix on the diagonal blocks except for the block with eigenvectors corresponding to substructure i.

Moreover, because the final AMLS transformation matrix is the product of all substructure transformation matrices, $\hat{\Psi}_s$ in Equation (15) denotes fully coupled constraint modes matrix as shown below in Equation (16):

$$\hat{\Psi}_s = [\Pi_{i=1}^n \Psi_s^{(i)}] \quad \text{Eq. (16)}$$

Figure 3:
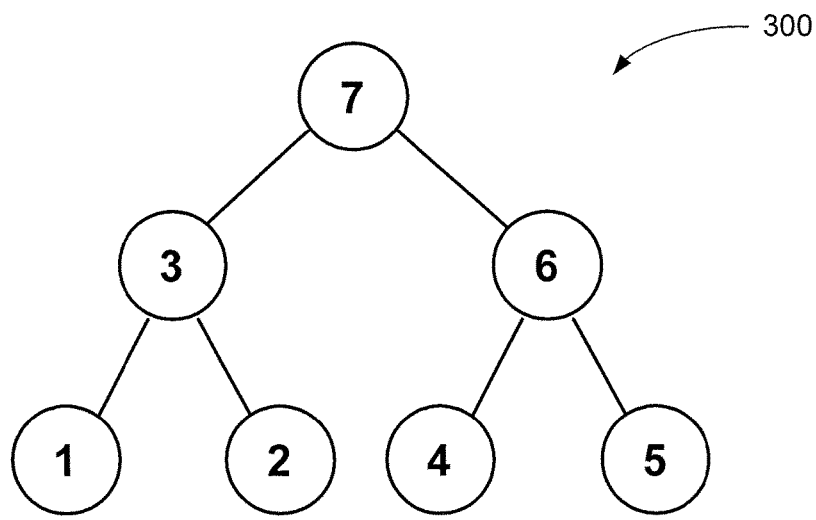
FIG. 3 is a multi-level substructure tree of a partitioned system.

FIG. 3 is a two-level substructure tree 300 of a partitioned system. Using the above-described process, for substructure 1, $\Psi_s^{(1)}$ is expressed as shown in Equation (17):

$$\Psi_s^{(1)} = \begin{bmatrix} I_1 & 0 & \Psi_{13} & 0 & 0 & 0 & \Psi_{17} \\ 0 & I_2 & 0 & 0 & 0 & 0 & 0 \\ 0 & 0 & I_3 & 0 & 0 & 0 & 0 \\ 0 & 0 & 0 & I_4 & 0 & 0 & 0 \\ 0 & 0 & 0 & 0 & I_5 & 0 & 0 \\ 0 & 0 & 0 & 0 & 0 & I_6 & 0 \\ 0 & 0 & 0 & 0 & 0 & 0 & I_7 \end{bmatrix} \quad \text{Eq. (17)}$$

Similarly, substructure 2's $\Psi_s^{(2)}$ is given by Equation (18):

$$\Psi_S^{(2)} = \begin{bmatrix} I_1 & 0 & 0 & 0 & 0 & 0 & 0 \\ 0 & I_2 & \Psi_{23} & 0 & 0 & 0 & \Psi_{27} \\ 0 & 0 & I_3 & 0 & 0 & 0 & 0 \\ 0 & 0 & 0 & I_4 & 0 & 0 & 0 \\ 0 & 0 & 0 & 0 & I_5 & 0 & 0 \\ 0 & 0 & 0 & 0 & 0 & I_6 & 0 \\ 0 & 0 & 0 & 0 & 0 & 0 & I_7 \end{bmatrix} \quad \text{Eq. (18)}$$

Moreover, substructure 3, $\Psi_s^{(3)}$ is given by Equation (19):

$$\Psi_S^{(3)} = \begin{bmatrix} I_1 & 0 & 0 & 0 & 0 & 0 & 0 \\ 0 & I_2 & 0 & 0 & 0 & 0 & 0 \\ 0 & 0 & I_3 & 0 & 0 & 0 & \Psi_{37} \\ 0 & 0 & 0 & I_4 & 0 & 0 & 0 \\ 0 & 0 & 0 & 0 & I_5 & 0 & 0 \\ 0 & 0 & 0 & 0 & 0 & I_6 & 0 \\ 0 & 0 & 0 & 0 & 0 & 0 & I_7 \end{bmatrix} \quad \text{Eq. (19)}$$

The constraint modes matrices for substructures 4 and 5 are similar to those for substructures 1 and 2 and the constraint modes matrix for substructure 7 becomes completely an identity matrix. Hence, the final matrix of constraint modes can be expressed by Equation (20):

$$\hat{\Psi}_S = \prod_{i=1}^{7} \Psi_S^{(i)} = \begin{bmatrix} I_1 & 0 & \hat{\Psi}_{13} & 0 & 0 & 0 & \hat{\Psi}_{17} \\ 0 & I_2 & \hat{\Psi}_{23} & 0 & 0 & 0 & \hat{\Psi}_{27} \\ 0 & 0 & I_3 & 0 & 0 & 0 & \hat{\Psi}_{37} \\ 0 & 0 & 0 & I_4 & 0 & \hat{\Psi}_{46} & \hat{\Psi}_{47} \\ 0 & 0 & 0 & 0 & I_5 & \hat{\Psi}_{56} & \hat{\Psi}_{57} \\ 0 & 0 & 0 & 0 & 0 & I_6 & \hat{\Psi}_{67} \\ 0 & 0 & 0 & 0 & 0 & 0 & I_7 \end{bmatrix} \quad \text{Eq. (20)}$$

where $\hat{\Psi}_{ij}$ denotes the constraint modes coupling between substructures i and j as shown in Equation (21):

$$\hat{\Psi}_{ij} = \Psi_{ij} + \sum_{k \in \delta_{ij}} \left( \Psi_{ik} \hat{\Psi}_{kj} \right) \quad \text{Eq. (21)}$$

and where $\mathcal{S}_{i,j}$ is the set of indices for ancestors of substructure i that are descendants of substructure j.

In an exemplary embodiment, for a substructure eigenmodes matrix, substructure 1's $\Phi_s^{(1)}$ is expressed as shown in Equation (22):

$$\Phi_S^{(1)} = \begin{bmatrix} \Phi_1 & 0 & 0 & 0 & 0 & 0 & 0 \\ 0 & I_2 & 0 & 0 & 0 & 0 & 0 \\ 0 & 0 & I_3 & 0 & 0 & 0 & 0 \\ 0 & 0 & 0 & I_4 & 0 & 0 & 0 \\ 0 & 0 & 0 & 0 & I_5 & 0 & 0 \\ 0 & 0 & 0 & 0 & 0 & I_6 & 0 \\ 0 & 0 & 0 & 0 & 0 & 0 & I_7 \end{bmatrix} \quad \text{Eq. (22)}$$

The substructure eigenmodes matrix for each substructure is the same as substructure 1 except that the eigenmodes matrix appears in the corresponding diagonal block. Hence, the final substructure eigenmodes matrix can be expressed as shown in Equation (23):

$$\Phi_S = \prod_{i=1}^{7} \Phi_S^{(i)} = \begin{bmatrix} \Phi_1 & 0 & 0 & 0 & 0 & 0 & 0 \\ 0 & \Phi_2 & 0 & 0 & 0 & 0 & 0 \\ 0 & 0 & \Phi_3 & 0 & 0 & 0 & 0 \\ 0 & 0 & 0 & \Phi_4 & 0 & 0 & 0 \\ 0 & 0 & 0 & 0 & \Phi_5 & 0 & 0 \\ 0 & 0 & 0 & 0 & 0 & \Phi_6 & 0 \\ 0 & 0 & 0 & 0 & 0 & 0 & \Phi_7 \end{bmatrix} \quad \text{Eq. (23)}$$

Because each substructure eigenmodes matrix is block-diagonal, there is no coupling terms in the final matrix. Therefore the AMLS transformation matrix can be expressed as shown in Equation (24):

$$T_A = \hat{\Psi}_S \Phi_S = \begin{bmatrix} I_1 & 0 & \hat{\Psi}_{13} & 0 & 0 & 0 & \hat{\Psi}_{17} \\ 0 & I_2 & \hat{\Psi}_{23} & 0 & 0 & 0 & \hat{\Psi}_{27} \\ 0 & 0 & I_3 & 0 & 0 & 0 & \hat{\Psi}_{37} \\ 0 & 0 & 0 & I_4 & 0 & \hat{\Psi}_{46} & \hat{\Psi}_{47} \\ 0 & 0 & 0 & 0 & I_5 & \hat{\Psi}_{56} & \hat{\Psi}_{57} \\ 0 & 0 & 0 & 0 & 0 & I_6 & \hat{\Psi}_{67} \\ 0 & 0 & 0 & 0 & 0 & 0 & I_7 \end{bmatrix} \quad \text{Eq. (24)}$$

$$\begin{bmatrix} \Phi_1 & 0 & 0 & 0 & 0 & 0 & 0 \\ 0 & \Phi_2 & 0 & 0 & 0 & 0 & 0 \\ 0 & 0 & \Phi_3 & 0 & 0 & 0 & 0 \\ 0 & 0 & 0 & \Phi_4 & 0 & 0 & 0 \\ 0 & 0 & 0 & 0 & \Phi_5 & 0 & 0 \\ 0 & 0 & 0 & 0 & 0 & \Phi_6 & 0 \\ 0 & 0 & 0 & 0 & 0 & 0 & \Phi_7 \end{bmatrix}$$

During the AMLS transformation process, a substructure constraint mode matrix $\Psi_s^{(i)}$ and a substructure eigenmode matrix $\Phi_s^{(i)}$ are applied from both the left and right sides of mass and stiffness matrices to incrementally transform system matrices. A substructure constraint mode matrix $\Psi_s^{(i)}$ can be called, in a numerical linear algebraic sense, as a block elementary Gaussian eliminator of the stiffness matrix for the blocks corresponding to substructure i. So, the blocks of the stiffness matrix corresponding to substructure i are eliminated by applying this Gaussian eliminator, and the transformed stiffness matrix will be block diagonal after all substructure constraint mode matrices are applied. The substructure eigenmodes are computed as the progress of block Gaussian elimination of the stiffness matrix is made towards the root of the substructure tree in the AMLS transformation. These two operations, Gaussian elimination and substructure eigenmodes computation, can be separated. In other words, the system matrices can be factorized first and then the eigenvalue problem of each substructure can be solved later.

Splitting the AMLS transformation into two parts leads to a new form of Craig-Bampton transformation matrix. The Craig-Bampton transformation matrix in Equation (3) combined with Equations (14) and (15) can be expressed as shown in Equation (25):

$$T_{CB} = \qquad \text{Eq. (25)}$$

$$\begin{pmatrix} \Phi_e & \Psi_{er} \\ 0 & I_r \end{pmatrix} = \begin{pmatrix} T_A \Phi_A & \Psi_{er} \\ 0 & I_r \end{pmatrix} = \begin{pmatrix} \hat{\Psi}_e & \Psi_{er} \\ 0 & I_r \end{pmatrix} \begin{pmatrix} \Phi_S & 0 \\ 0 & I_r \end{pmatrix} \begin{pmatrix} \Phi_A & 0 \\ 0 & I_r \end{pmatrix}$$

In Equation (25), $\Psi_{er}$ can be combined into $\hat{\Psi}_s$ since $\Psi_{er}$ is by definition a block Gaussian eliminator of the stiffness matrix corresponding to the coupling between eliminated degrees of freedom and retained degrees of freedom. In other words, a block factorization of $K_{er}$ can be performed during the block factorization of the entire stiffness matrix in the AMLS transformation. This makes each $\Psi_s^{(i)}$ having an extended rows and columns for each substructure, which correspond to the retrained degree-of-freedom substructure. For example, we can define a root substructure which contains only the retained degrees of freedom and so the previous two-level substructure tree 400 can be rearranged as shown in FIG. 4.

Figure 4:
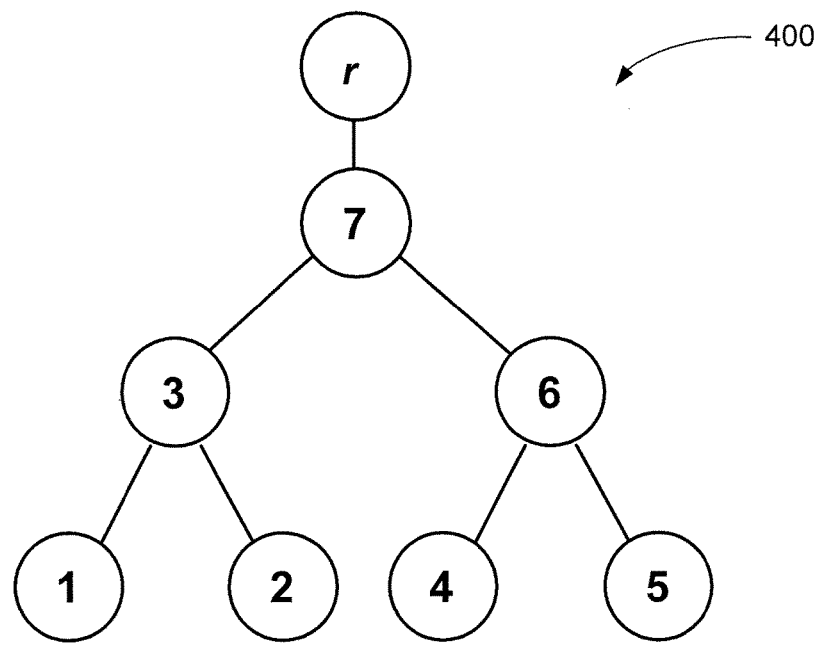
FIG. 4 is a multi-level substructure tree of a partitioned system, including a retained degree of freedom.

Referring still to FIG. 4, $\Psi_s^{(1)}$ for this substructure tree can be written as shown in Equation (26):

$$\Psi_S^{(1)} = \begin{bmatrix} I_1 & 0 & \Psi_{13} & 0 & 0 & 0 & \Psi_{17} & \Psi_{1r} \\ 0 & I_2 & 0 & 0 & 0 & 0 & 0 & 0 \\ 0 & 0 & I_3 & 0 & 0 & 0 & 0 & 0 \\ 0 & 0 & 0 & I_4 & 0 & 0 & 0 & 0 \\ 0 & 0 & 0 & 0 & I_5 & 0 & 0 & 0 \\ 0 & 0 & 0 & 0 & 0 & I_6 & 0 & 0 \\ 0 & 0 & 0 & 0 & 0 & 0 & I_7 & 0 \\ 0 & 0 & 0 & 0 & 0 & 0 & 0 & I_r \end{bmatrix} \qquad \text{Eq. (26)}$$

Moreover, the constraint modes $\Psi$ can be expressed as shown in Equation (27):

$$\Psi = \begin{bmatrix} \hat{\Psi}_{1r} \\ \hat{\Psi}_{2r} \\ \hat{\Psi}_{3r} \\ \hat{\Psi}_{4r} \\ \hat{\Psi}_{5r} \\ \hat{\Psi}_{6r} \\ \hat{\Psi}_{7r} \\ I_r \end{bmatrix} \qquad \text{Eq. (27)}$$

Here, $\hat{\Psi}_{ir}$ represents a fully coupled block of the Gaussian eliminator corresponding to the substructure i due to multi-level extension. Each $\hat{\Psi}_{ir}$ can be computed using the following formulation similar to Equation (21) as shown in Equation (28):

$$\hat{\Psi}_{ir} = \Psi_{ir} + \sum_{k \in \mathcal{A}} (\Psi_{ik} \hat{\Psi}_{kr}) \qquad \text{Eq. (28)}$$

where, $\mathcal{A}$ denotes the set of substructures which are the ancestors of substructure i except the root substructure that contains the retained degrees of freedom. Since $\hat{\Psi}_{ir}$ is recursively computed, it can be computed after the AMLS transformation. However, since $\Psi_{ir}$ is calculated at each substructure i, a static condensation (or Schur complement) contribution from substructure i to the retained degrees of freedom, $K_{rr}^{(i)}$, is calculated at each substructure i and can be added to the final static condensation later. Therefore, the final condensed stiffness matrix for only retained degrees of freedom, shown in Equation (29), is computed by assembling the stiffness matrix of the root substructure. Here $\tilde{K}_{ir}^T$ denotes that intermediate product contains all the contribution from all its descendants.

$$\hat{K}_{rr} = K_{rr} + \sum_{i=1}^{7} K_{rr}^{(i)} = K_{rr} + \sum_{i=1}^{7} (\tilde{K}_{ir}^T \Psi_{ir}) \qquad \text{Eq. (29)}$$

Similarly, the final condensed mass matrix is assembled as shown in Equation (30). Here $\tilde{M}_{ii}$ and $\tilde{M}_{ir}$ denote that intermediate products contain all the contribution from its all descendants.

$$\hat{M}_{rr} = M_{rr} + \sum_{i=1}^{7} M_{rr}^{(i)} = M_{rr} + \sum_{i=1}^{7} \left( \Psi_{ir}^T (\tilde{M}_{ii} \Psi_{ir} + \tilde{M}_{ir}) + \tilde{M}_{ir} \Psi_{ir} \right) \qquad \text{Eq. (30)}$$

Therefore, by assembling the stiffness and mass matrices for the root substructure which has only retained degrees of freedom (substructure r), the condensed stiffness and mass matrices can be obtained as shown in Equations (29) and (30). Notably, in the AMLS transformation, an eigenproblem for the retained substructure is not solved and so the off-diagonal mass coupling between the retained substructure and eliminated substructures are not reduced.

Furthermore, if the reduced eigenmodes ($\Phi_A$) are computed for the eliminated degree-of-freedom substructures, the condensed off-diagonal mass matrix can be computed with the reduced eigenmodes. This is shown in Equation (31).

$$\begin{aligned} \hat{M}_{\alpha r} &= \Phi_e^T (M_{ee} \Psi_{er} + M_{er}) \\ &= \Phi_A^T T_A^T (M_{ee} \Psi_{er} + M_{er}) \\ &= \Phi_A^T \{ \Phi_S^T \hat{\Psi}_S^T (M_{ee} \Psi_{er} + M_{er}) \} \\ &= \Phi_A^T \{ \Phi_S^T \hat{M}_{er} \} \\ &= \Phi_A^T \hat{\mu}_{er} \end{aligned} \qquad \text{Eq. (31)}$$

In Equation (28), $\hat{\mu}_{er}$ is a left-hand-side reduced mass coupling between the retained and eliminated degrees of freedom, which can be easily obtained by not doing the reduction with the eigenmodes of the retained substructure in the AMLS transformation. Accordingly, the condensed Craig-Bampton matrices, $\hat{K}_{rr}$ and $\hat{M}_{rr}$, are computed during the AMLS transformation. The condensed off-diagonal mass matrix $\hat{M}_{\alpha r}$ can be computed by pre-multiplying the reduced eigenmodes by the one-side reduced mass coupling $\hat{\mu}_{er}$ after computing the reduced eigenmodes for the substructures with only eliminated degrees of freedom.

In a similar way to the mass matrix condensation, a symmetric damping matrix can be projected on Craig-Bampton subspace except for the diagonal block. $\hat{D}_{rr}$ and $\hat{D}_{\alpha r}$ can be computed in the same way as for the mass matrix condensation. The diagonal block of damping matrix $\hat{D}_{\alpha \alpha}$ is the modal damping matrix, which is normally calculated in the AMLS recovery phase for the subsequent steady-state dynamics analysis. This modal damping matrix can be computed on the reduced AMLS subspace as derived in Equation (32).

$$\hat{D}_{\alpha\alpha} = \Phi_e^T D_{ee} \Phi_e = \Phi_A^T [T_A^T D_{ee} T_A] \Phi_A = \Phi_A^T D_A \Phi_A \qquad \text{Eq. (32)}$$

Therefore, any symmetric damping matrix can be condensed during the course of the AMLS transformation process, as well.

Regarding the force vector condensation, the condensed force vectors can be expressed in terms of the AMLS reduced eigenmodes as shown in Equation (33).

$$\hat{F} = \begin{Bmatrix} \hat{F}_\alpha \\ \hat{F}_r \end{Bmatrix} = \begin{Bmatrix} \Phi_e^T F_e \\ \Psi_{er}^T F_e + F_r \end{Bmatrix} = \begin{Bmatrix} \Phi_A^T (T_A^T F_e) \\ \Psi_{er}^T F_e + F_r \end{Bmatrix} = \begin{Bmatrix} \Phi_A^T F_A \\ \Psi_{er}^T F_e + F_r \end{Bmatrix} \qquad \text{Eq. (33)}$$

In an exemplary embodiment, the modal force vectors, $\hat{F}_\alpha = \Phi_e^T F_e$, are computed in the AMLS recovery phase. The condensed force vectors for the retained degrees of freedom $\hat{F}_r$ can be calculated as full right-hand-side vectors. If the forced degrees of freedom are confined in the last substructure right below the root substructure in the substructure tree, the computation becomes simpler. For example, if the forced degrees of freedom are contained in only substructure 7 and substructure r, the condensed force vectors can be computed as shown in Equation (34):

$$\hat{F}_r = \hat{\Psi}_{er}^T F_e + F_r = \Psi_{7r}^T F_7 + F_r \qquad \text{Eq. (34)}$$

Consequently, the global eigenmodes, constraint modes, and all the condensed substructure system matrices can be computed during the AMLS eigensolution procedure. This means that the computational phases for computing the constraint modes and projection of all the system matrices on to the Craig-Bampton subspace in the substructure generation procedure are eliminated. In other words, substructure generation procedure is completely embedded in the AMLS eigensolution procedure. This will remove the requirement of full eigenmodes in the AMLS eigensolution procedure for subsequent substructure generation, which will relieve a huge amount of computer resource usage related to full eigenmodes for large models.

Referring again to FIG. 2, a plurality of retained degrees of freedom are combined 204 in a root substructure. A structure is then partitioned 206 into a plurality of substructures in multiple levels, and the structure is then reduced 208 onto substructures modal subspaces. Notably, however, the root substructure modal subspace is not computed and the root substructure is not reduced. The resulting reduced eigenproblem is solved 210 to recover 212 the eigenmodes and to compute a plurality of constraint modes and condensed operators, all of which are stored 214 in a memory area.

In an exemplary embodiment, because the AMLS and Craig-Bampton procedures are integrated, there is no need to do any computation to generate one or more substructures. Accordingly, substructure normal modes and constraint modes, and condensed substructure system matrices are computed with very little additional computational costs. The embodiments described above significantly enhance the performance of substructure generation process, and reduces the computational resource usage by eliminating requirement of the use and computation of full substructure modes.

Figure 5:
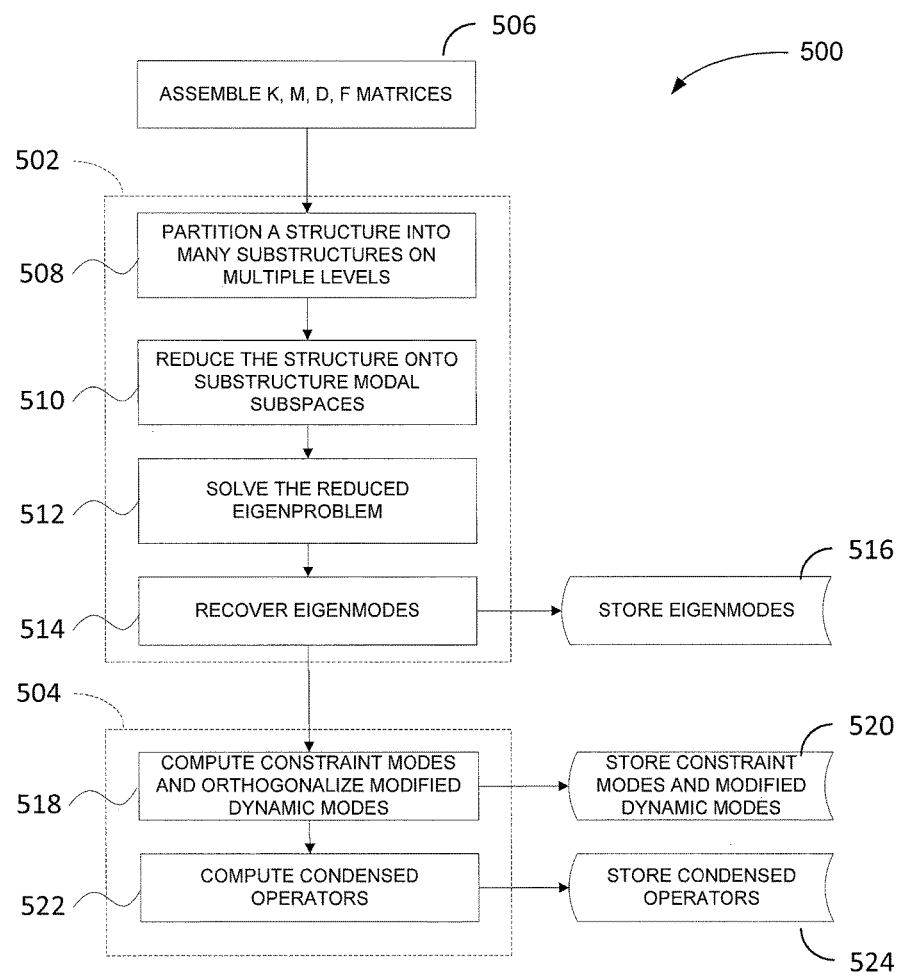
FIG. 5 is a flowchart that illustrates a known process similar to that shown in FIG. 1, in which a conventional Craig-Chang (or free-interface) substructure can be generated using free-interface normal modes and constraint modes.

FIG. 5 is a flowchart 500 that illustrates a known process similar to that shown in FIG. 1 above, in which a conventional Craig-Chang (or free-interface) substructure can be generated using free-interface normal modes and the constraint modes. More specifically, FIG. 5 illustrates a known process that includes an AMLS technique 502 for recovering eigenmodes and a known Craig-Chang, or free-interface, substructure generation technique 504. In the known process, system matrices are assembled 506 for a 3D representation or model of a physical object, including stiffness matrices, mass matrices, damping matrices, and/or force vector matrices using the same or similar operations described above with respect to FIG. 1. Moreover, because this method uses the same constraint modes as Craig-Bampton method, the substructure generation procedure can also be embedded in the AMLS eigensolution procedure.

Assuming the same system matrices partitioned as in Equation (1) above, the transformation matrix of the Craig-Chang method can be written as shown in Equation (35):

$$\begin{Bmatrix} u_e \\ u_r \end{Bmatrix} = \begin{pmatrix} \Phi_{e\alpha} & \Psi_{er} \\ \Phi_{r\alpha} & I_r \end{pmatrix} \begin{Bmatrix} \eta_e \\ u_r \end{Bmatrix} = [\Phi \ \Psi] \begin{Bmatrix} \eta_e \\ u_r \end{Bmatrix} = T_{CC} \begin{Bmatrix} \eta_e \\ u_r \end{Bmatrix} \qquad \text{Eq. (35)}$$

Moreover, the condensed stiffness and mass matrices using the Craig-Chang transformation matrix are written as shown in Equation (36):

$$\hat{K} = T_{CC}^T K T_{CC} = \begin{pmatrix} \Lambda_{AA} & \hat{K}_{ar} \\ \hat{K}_{ar}^T & \hat{K}_{rr} \end{pmatrix}, \qquad \text{Eq. (36)}$$

$$\hat{M} = T_{CC}^T M T_{CC} = \begin{pmatrix} I_{\alpha\alpha} & \hat{M}_{ar} \\ \hat{M}_{ar}^T & \hat{M}_{rr} \end{pmatrix}$$

where $\hat{K}_{rr}$ and $\hat{M}_{rr}$ are expressed as the shown in Equations (6) and (7) and the off-diagonal blocks of stiffness and mass matrices are expressed as shown in Equations (37) and (38):

$$\hat{K}_{ar} = \Phi^T K \Psi \qquad \text{Eq. (37)}$$

$$\hat{M}_{ar} = \Phi^T M \Psi \qquad \text{Eq. (38)}$$

Unlike the Craig-Bampton method, the condensed stiffness matrix has non-zero off-diagonal block due to the non-orthogonality relation between the free-interface eigenmodes and the constraint modes with respect to the stiffness matrix. In other words, there may be a linear dependency between the free-interface eigenmodes and the constraint modes, which will cause a rank-deficient problem in the condensed system since the boundary conditions for the eigenmodes are not imposed on the retained degrees of freedom.

By combining the free-interface eigenmodes $\Phi$ with the constraint modes $\Psi$, the modified dynamic modes can be obtained, and which ensure linear independence between the modified dynamic modes and the constraint modes. By subtracting the constraint modes from the free-interface eigenmodes, the modified dynamic modes can be made orthogonal to the constraint modes with respect to the stiffness matrix, as shown in Equation (39):

$$\overline{\Phi}^T K \Psi = 0 \qquad \text{Eq. (39)}$$

Hence, the modified dynamic modes can be expressed as shown in Equation (40):

$$\overline{\Phi} = \Phi - \Psi \Phi_{r\alpha} = \begin{pmatrix} \Phi_{e\alpha} - \Psi_{er} \Phi_{r\alpha} \\ 0 \end{pmatrix} = \begin{pmatrix} \overline{\Phi}_e \\ 0 \end{pmatrix} \qquad \text{Eq. (40)}$$

It should be noted that the modified dynamic modes may contain null vectors or linearly dependent vectors due to the cancellation with the constraint modes. To avoid singular condensed system, the modified dynamic modes should be orthogonalized among themselves with respect to stiffness and mass matrices. This orthogonalization process causes significant computational costs for large models with a large number of required eigenmodes.

With the orthogonal modified fixed-interface dynamic modes, a new form of Craig-Chang transformation matrix can be written as shown in Equation (41):

$$\begin{Bmatrix} u_e \\ u_r \end{Bmatrix} = \begin{pmatrix} \Phi_{ea} - \Psi_{er}\Phi_{ra} & \Psi_{er} \\ 0 & I_r \end{pmatrix} \begin{Bmatrix} \eta_e \\ u_r \end{Bmatrix} = [\overline{\Phi} \ \Psi] \begin{Bmatrix} \eta_e \\ u_r \end{Bmatrix} = \overline{T}_{CC} \begin{Bmatrix} \eta_e \\ u_r \end{Bmatrix}$$

Eq. (41)

With this transformation matrix, the condensed stiffness and mass matrices can be written as shown in Equations (42) and (43):

$$\hat{K} = \overline{T}_{CC}^T K \overline{T}_{CC} = \begin{pmatrix} \hat{K}_{aa} & 0 \\ 0 & \hat{K}_{rr} \end{pmatrix}$$

Eq. (42)

$$\hat{M} = \overline{T}_{CC}^T M \overline{T}_{CC} = \begin{pmatrix} \hat{M}_{aa} & \hat{M}_{ar} \\ \hat{M}_{ar}^T & \hat{M}_{rr} \end{pmatrix}$$

Eq. (43)

where $$\hat{K}_{aa} = \overline{\Phi}^T K \overline{\Phi} = \overline{\Lambda}_{aa}$$

Eq. (44)

$$\hat{K}_{rr} = K_{rr} - K_{er}^T K_{ee}^{-1} K_{er} = K_{rr} + K_{er}^T \Psi_{er}$$

Eq. (45)

$$\hat{M}_{aa} = \overline{\Phi}^T M \overline{\Phi} = \overline{I}_{aa}$$

Eq. (46)

$$\hat{M}_{ar} = \overline{\Phi}^T M \Psi$$

Eq. (47)

$$\hat{M}_{rr} = M_{rr} + \Psi_{er}^T(M_{ee}\Psi_{er} + M_{er}) + M_{er}^T \Psi_{er}$$

Eq. (48)

Accordingly, the condensed damping matrix can also be written as shown in Equation (49):

$$\hat{D} = \overline{T}_{CC}^T D \overline{T}_{CC} = \begin{pmatrix} \hat{D}_{aa} & \hat{D}_{ar} \\ \hat{D}_{ar}^T & \hat{D}_{rr} \end{pmatrix}$$

Eq. (49)

where $$\hat{D}_{aa} = \overline{\Phi}^T D \overline{\Phi} = \overline{\Phi}_e^T D_{ee} \overline{\Phi}_e$$

Eq. (50)

$$\hat{D}_{ar} = \overline{\Phi}^T D \Psi$$

Eq. (51)

$$\hat{D}_{rr} = D_{rr} + \Psi_{er}^T(D_{ee}\Psi_{er} + D_{er}) + D_{er}^T \Psi_{er}$$

Eq. (52)

In addition, condensed force vectors can be written as shown in Equation (53):

$$\hat{F} = \begin{Bmatrix} \hat{F}_e \\ \hat{F}_r \end{Bmatrix} = \begin{pmatrix} \overline{\Phi}_e & \Psi_{er} \\ 0 & I_r \end{pmatrix}^T \begin{Bmatrix} F_e \\ F_r \end{Bmatrix} = \begin{Bmatrix} \overline{\Phi}_e^T F_e \\ \Psi_{er}^T F_e + F_r \end{Bmatrix}$$

Eq. (53)

Accordingly, in the AMLS procedure 502, a structure is partitioned 508 into a plurality of substructures in multiple levels, and the structure is then reduced 510 onto substructures modal subspaces. The resulting eigenproblem is solved 512 to compute 514 the eigenmodes, which are stored 516 in a memory area.

In the Craig-Chang procedure 504, a plurality of constraint modes are computed and modified dynamic modes are orthogonalized 518, and the modified dynamic modes and constraint modes are stored 520 in a memory area. Thereafter, condensed operators are computed 522 and stored 524 in a memory area.

Similar to the process illustrated in FIG. 1, there are known disadvantages of using the above-described process of FIG. 5. For example, this known process takes significant computational time and requires a huge amount of computer resources because the full substructure modes for a large substructure need to be stored for recovery later and retrieved for the condensed matrix computation in the substructure generation process. Within a conventional dynamic substructure generation procedure for large-scale models, computing eigenmodes is mandatory and the costs of computing constraint modes and projecting system matrices onto substructure modal space are very high because the projection is performed using full substructure modes in the physical space, the size of which can easily be more than tens of millions degrees of freedom. This requires large data storage areas and uses increasingly large amounts of time to transfer portions of the data from one memory area, such as a hard disk, to another memory area, such as operating memory.

Figure 6:
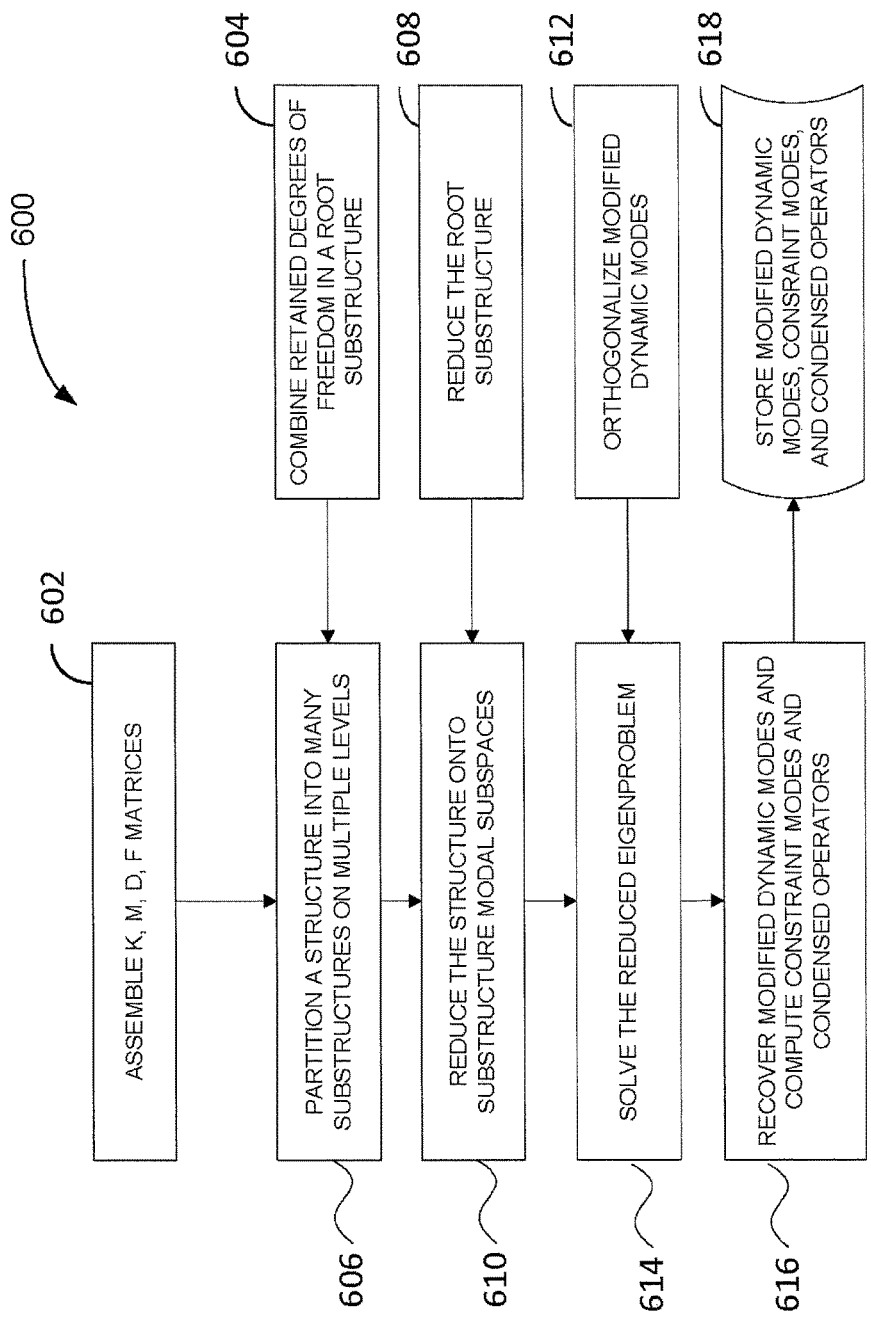
FIG. 6 is a flowchart that illustrates an exemplary method that includes an AMLS-based Craig-Chang process for use in FEA of 3D representations of physical objects.

FIG. 6 is a flowchart 600 that illustrates an exemplary method that integrates an AMLS-based Craig-Chang process for use in FEA of 3D representations of physical objects. Similar to the AMLS-based Craig-Bampton substructure generation method described above in reference to FIGS. 2-4, the Craig-Chang substructure can be generated within the AMLS eigensolution process. However in the case of Craig-Chang method the eigenproblem for the retained substructure is solved for subsequent computation of the free-interface reduced eigenmodes for the entire reduced system. In this case, orthogonalization of the modified dynamic modes can be done in the reduced AMLS subspace instead of the physical FE space, which will greatly reduce costs of orthogonalization of the modified dynamic modes. More specifically, FIG. 6 illustrates an exemplary method that includes integration of an AMLS-based process and a Craig-Chang process for use in FEA of 3D representations of physical objects. In an exemplary embodiment, system matrices are assembled 602 for a 3D representation or model of a physical object, including stiffness matrices, mass matrices, damping matrices, and/or force vector matrices, as described above with respect to FIG. 1.

Similarly to Equation (26), the eigenmodes computed by AMLS for the entire system, which includes a root substructure that contains only the retained degrees of freedom, can be expressed as shown in Equation (54):

$$\Phi = \begin{Bmatrix} \Phi_{ea} \\ \Phi_{ra} \end{Bmatrix} = T_A \Phi_A = \hat{\Psi}_s \Phi_s \Phi_A = \begin{pmatrix} \hat{\Psi}_{ee} & \Psi_{er} \\ 0 & I_r \end{pmatrix} \begin{pmatrix} \Phi_s^e & 0 \\ 0 & \Phi_A^r \end{pmatrix} \begin{pmatrix} \Phi_A^{ea} \\ \Phi_A^{ra} \end{pmatrix}$$

Eq. (54)

where $T_A$ is an AMLS transformation matrix for the entire system and $\Phi_A$ is a free-interface reduced eigenmodes, which can be partitioned into two sub-matrices ($\Phi_A^{ea}$ and $\Phi_A^{ra}$) based on whether the substructure has eliminated DOFs or retained DOFs. $\Phi_s^e$ is a block diagonal matrix in which each diagonal block is filled with the eigenmodes of each substructure with the eliminated degrees of freedom, and $\Phi_s^r$ is the eigenmodes of the root substructure with only retained degrees of freedom. From Equation (54), $\Phi_{r\alpha}$ can be expressed as shown in Equation (55):

$$\Phi_{r\alpha} = \Phi_s^r \Phi_A^{r\alpha} \qquad \text{Eq. (55)}$$

The modified dynamic modes can be simplified using Equations (54) and (55) as shown in Equation (56):

$$\begin{aligned}
\Phi &= T_A \Phi_A - \Psi \Phi_{r\alpha} & \text{Eq. (56)} \\
&= \hat{\Psi}_s \Phi_s \Phi_A - \Psi \Phi_{r\alpha} \\
&= \begin{pmatrix} \Psi_{ee} & \Psi_{er} \\ 0 & I_r \end{pmatrix} \begin{pmatrix} \Phi_s^e & 0 \\ 0 & \Phi_s^r \end{pmatrix} \begin{pmatrix} \Phi_A^{e\alpha} \\ \Phi_A^{r\alpha} \end{pmatrix} - \begin{pmatrix} \Psi_{er} \\ I \end{pmatrix} \Phi_{r\alpha} \\
&= \begin{pmatrix} \Psi_{ee} & \Psi_{er} \\ 0 & I_r \end{pmatrix} \begin{pmatrix} \Phi_s^e \Phi_A^{e\alpha} \\ \Phi_s^r \Phi_A^{r\alpha} \end{pmatrix} - \begin{pmatrix} \Psi_{er} \\ I \end{pmatrix} \Phi_s^r \Phi_A^{r\alpha} \\
&= \begin{pmatrix} \Psi_{ee} \Phi_s^e \Phi_A^{e\alpha} \\ 0 \end{pmatrix}
\end{aligned}$$

Because the subspace consisting of the column vectors of $(\hat{\Psi}_{ee} \Phi_s^e)$ is linearly independent by its definition, only linear dependency of the modified dynamic modes can come from the term $\Phi_A^{e\alpha}$. Therefore, only the column vectors in $\Phi_A^{e\alpha}$ need to be orthogonalized to get the orthogonal modified dynamic modes. First, the column vectors of $\Phi_A^{e\alpha}$ are orthogonalized with respect to the reduced stiffness matrix $K_A$ to remove the linear dependency among the vectors using modified Gram-Schmidt algorithm. Since the null vectors are eliminated during this orthogonalization process, the column dimension of the modified dynamic modes can be reduced. After the orthogonalization, Ritz analysis with stiffness-orthogonal $\Phi_A^{e\alpha}$ need to be performed to make them both stiffness- and mass-orthogonal vectors, such that orthogonal modified dynamic modes satisfy the following orthogonality conditions:

$$(\overline{\Phi}_A^{e\alpha})^T K_A \overline{\Phi}_A^{e\alpha} = \overline{\Lambda}_{\alpha\alpha} \qquad \text{Eq. (57)}$$

$$(\overline{\Phi}_A^{e\alpha})^T M_A \overline{\Phi}_A^{e\alpha} = \overline{I}_{\alpha\alpha} \qquad \text{Eq. (58)}$$

where $\overline{\Lambda}_{\alpha\alpha}$ is a diagonal matrix containing pseudo eigenvalues on its diagonal, which can be computed in the Ritz analysis.

With the orthogonal dynamic modes, the condensed stiffness matrix term $\hat{K}_{\alpha\alpha} = \overline{\Phi}^T K \overline{\Phi}$ becomes diagonal and its diagonal terms are pseudo eigenvalues ($\overline{\Lambda}_{\alpha\alpha}$) and the condensed mass matrix term $\hat{M}_{\alpha\alpha} = I_{\alpha\alpha}$ also becomes diagonal. The off-diagonal condensed mass matrix $\hat{M}_{\alpha r}$ can be computed in the AMLS reduced subspace since the modified dynamic modes are orthogonalized in the AMLS reduced subspace. This can be derived in the following Equation (59):

$$\begin{aligned}
\hat{M}_{\alpha r} &= \overline{\Phi}^T M \Psi & \text{Eq. (59)} \\
&= \begin{pmatrix} \hat{\Psi}_{ee} \Phi_s^e \overline{\Phi}_A^{e\alpha} \\ 0 \end{pmatrix}^T \begin{pmatrix} M_{ee} & M_{er} \\ M_{er}^T & M_{rr} \end{pmatrix} \begin{pmatrix} \Psi_{er} \\ I \end{pmatrix} \\
&= (\Phi_s^e \overline{\Phi}_A^{e\alpha})^T \left[ \begin{pmatrix} \hat{\Psi}_{ee} \\ 0 \end{pmatrix}^T \begin{pmatrix} M_{ee} & M_{er} \\ M_{er}^T & M_{rr} \end{pmatrix} \begin{pmatrix} \Psi_{er} \\ I \end{pmatrix} \right]
\end{aligned}$$

$$\begin{aligned}
&= (\overline{\Phi}_A^{e\alpha})^T \left[ (\Phi_s^e)^T \hat{M}_{er} \right] \\
&= (\overline{\Phi}_A^{e\alpha})^T \hat{\mu}_{er}
\end{aligned}$$

where $\overline{\Phi}_A^{e\alpha}$ is orthogonalized modified dynamic modes with respect to the reduced stiffness and mass matrices. This off-diagonal mass term has the same form as for the Craig-Bampton method except that the reduced eigenmodes for the eliminated substructures $\overline{\Phi}_A^{e\alpha}$ should be orthogonalized before computation.

For a condensed damping matrix, all the condensed damping terms can be calculated in the same way as for the mass matrix except for the diagonal damping term. The diagonal damping term can be computed as derived in Equation (60) below:

$$\begin{aligned}
\hat{D}_{\alpha\alpha} &= \overline{\Phi}^T D \overline{\Phi} & \text{Eq. (60)} \\
&= \begin{pmatrix} \hat{\Psi}_{ee} \Phi_s^e \overline{\Phi}_A^{e\alpha} \\ 0 \end{pmatrix}^T \begin{pmatrix} D_{ee} & D_{er} \\ D_{er}^T & D_{rr} \end{pmatrix} \begin{pmatrix} \Psi_{ee} \Phi_s^e \overline{\Phi}_A^{e\alpha} \\ 0 \end{pmatrix} \\
&= (\overline{\Phi}_A^{e\alpha})^T [(\Phi_s^e)^T (\Psi_{ee})^T D_{ee} \Psi_{ee} \Phi_s^e] \overline{\Phi}_A^{e\alpha} \\
&= (\overline{\Phi}_A^{e\alpha})^T D_A^e \overline{\Phi}_A^{e\alpha}
\end{aligned}$$

where $D_A^e$ is the reduced damping matrix for eliminated (degrees-of-freedom) substructures.

Accordingly, the condensed force vectors can be written as:

$$\begin{aligned}
\hat{F} &= \begin{Bmatrix} \hat{F}_\alpha \\ \hat{F}_r \end{Bmatrix} & \text{Eq. (61)} \\
&= \begin{pmatrix} \hat{\Psi}_{ee} \Phi_s^e \overline{\Phi}_A^{e\alpha} & \Psi_{er} \\ 0 & I_r \end{pmatrix}^T \begin{Bmatrix} F_e \\ F_r \end{Bmatrix} \\
&= \begin{Bmatrix} (\overline{\Phi}_A^{e\alpha})^T [(\hat{\Psi}_{ee} \Phi_s^e)^T F_e] \\ \Psi_{er}^T F_e + F_r \end{Bmatrix} \\
&= \begin{Bmatrix} (\overline{\Phi}_A^{e\alpha})^T F_A^e \\ \Psi_{er}^T F_e + F_r \end{Bmatrix}
\end{aligned}$$

where $\hat{F}_r$ are the root substructure's assembled force vectors and $\hat{F}_\alpha$ is the modal force vectors computed using the orthogonalized reduced dynamic modes and the reduced force vectors for the eliminated substructure.

Using the above-described method, the free-interface eigenmodes and constraint modes and all the condensed Craig-Chang substructure system matrices can be computed during the AMLS eigensolution procedure. The substructure generation process can be embedded in the AMLS eigensolution procedure like Craig-Bampton substructure generation using AMLS method. High costs of re-orthogonalization of the modified substructure dynamic modes can be significantly reduced due to the fact that the orthogonalization is done in the reduced AMLS subspace.

In an exemplary embodiment, a plurality of retained degrees of freedom are combined 604 in a root substructure. A structure is then partitioned 606 into a plurality of substructures in multiple levels. The root substructure is reduced 608 using its own eigenmodes, and so the whole structure is then also reduced 610 onto the substructures modal subspaces. Moreover, a plurality of resulting eigenmodes is computed by solving the resulting reduced eigenproblem 614 and orthogonalized modified dynamic modes 612. The modified dynamic modes are recovered 616 and a plurality of constraint modes and condensed operators are computed, all of which is stored 618 in a memory area.

In an exemplary embodiment, because the AMLS and Craig-Chang procedures are integrated, there is no need to do any computation to generate one or more substructures. Accordingly, and similar to the method shown in FIG. 2 above, substructure normal modes and constraint modes, and condensed substructure system matrices are computed with very little additional computational costs. The embodiments described above significantly enhance the performance of substructure generation process, and reduces the computational resource usage by eliminating requirement of the use and computation of full substructure modes.

Figure 7:
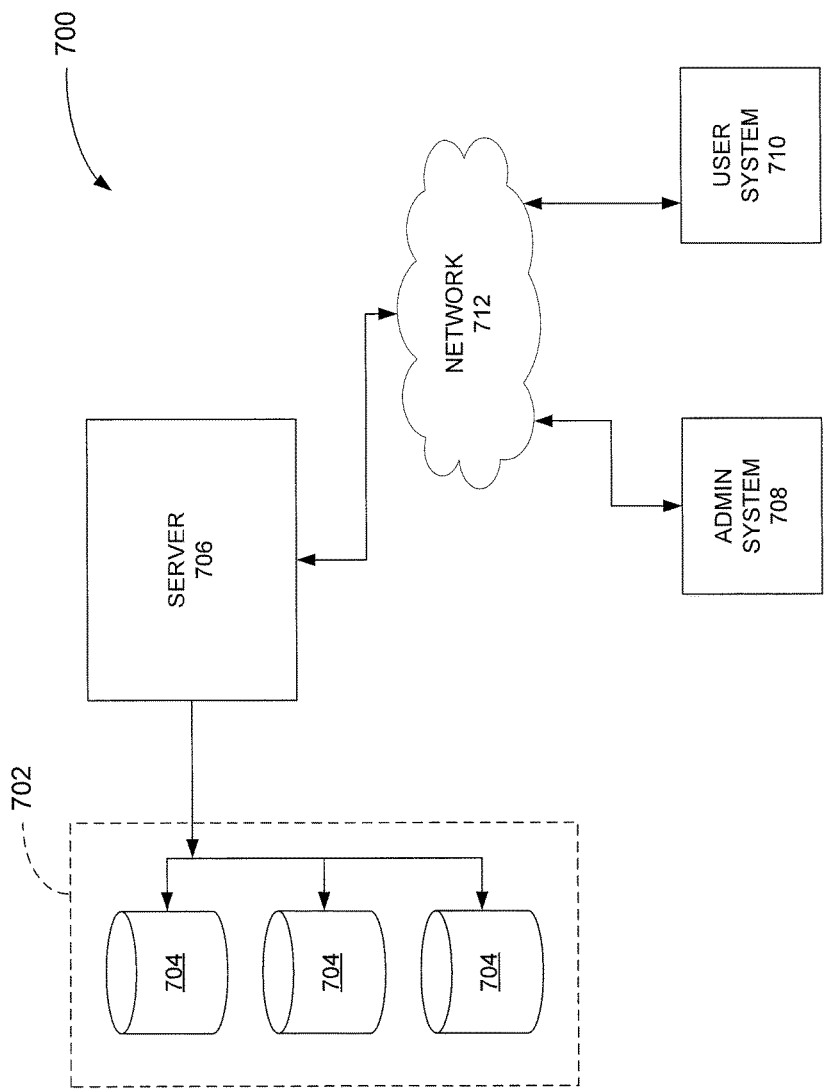
FIG. 7 is a schematic block diagram of an exemplary computer system for use in finite element analysis of 3D representations of physical objects.

FIG. 7 is a schematic block diagram of an exemplary computer system 700 for use in finite element analysis of 3D representations of physical objects, such as the processes described above and/or additional processes that may be related to those described above. In an exemplary embodiment, a memory area 702 includes one or more storage devices 704 for use in storing data, such as simulation data including, for example, system matrices, structure information, substructure information, eigenmodes, eigenvalues, constraint modes, orthogonalized eigenmodes, condensed operators, or any other suitable data type that can be used in an FEA simulation environment. In some embodiments, the memory area 702 is coupled to a server system 706, which is in turn coupled to an administrator system 708 and/or a user system 710 via a network 712. The storage devices 704 may be embodied as one or more databases, may be located at a single or at multiple geographical sites, or may be integrated with the server system 706.

As can be appreciated, the network 712 can be a public network, such as the Internet, or a private network such as an LAN or WAN network, or any combination thereof and can also include PSTN or ISDN sub-networks. The network 712 can also be wired, such as an Ethernet network, or can be wireless such as a cellular network including EDGE, 3G and 4G wireless cellular systems. The wireless network can also be WiFi, Bluetooth, or any other wireless form of communication that is known. Thus, the network 712 is merely exemplary and in no way limits the scope of the present advancements.

As one of ordinary skill in the art would recognize, the administrator system 708 and/or the user system 710 can be any suitable computer system such as the one described below with reference to FIG. 8, or any other computing system that is known. Moreover, it should be understood that the server system 706 is configured to perform the processes described above and/or any additional processes that may be related to those described above.

The server system 706 stores the computer-readable instructions to execute the processes described above and provides these instructions via the network 712 to the administrator system 708 and/or the user system 710. Moreover, the server system 706 can also provide data from the memory area 702 as needed to the administrator system 708 and the user system 710. As such, FIG. 7 includes implementations of the computer system 700 via cloud computing, distributed computing, and the like.

Figure 8:
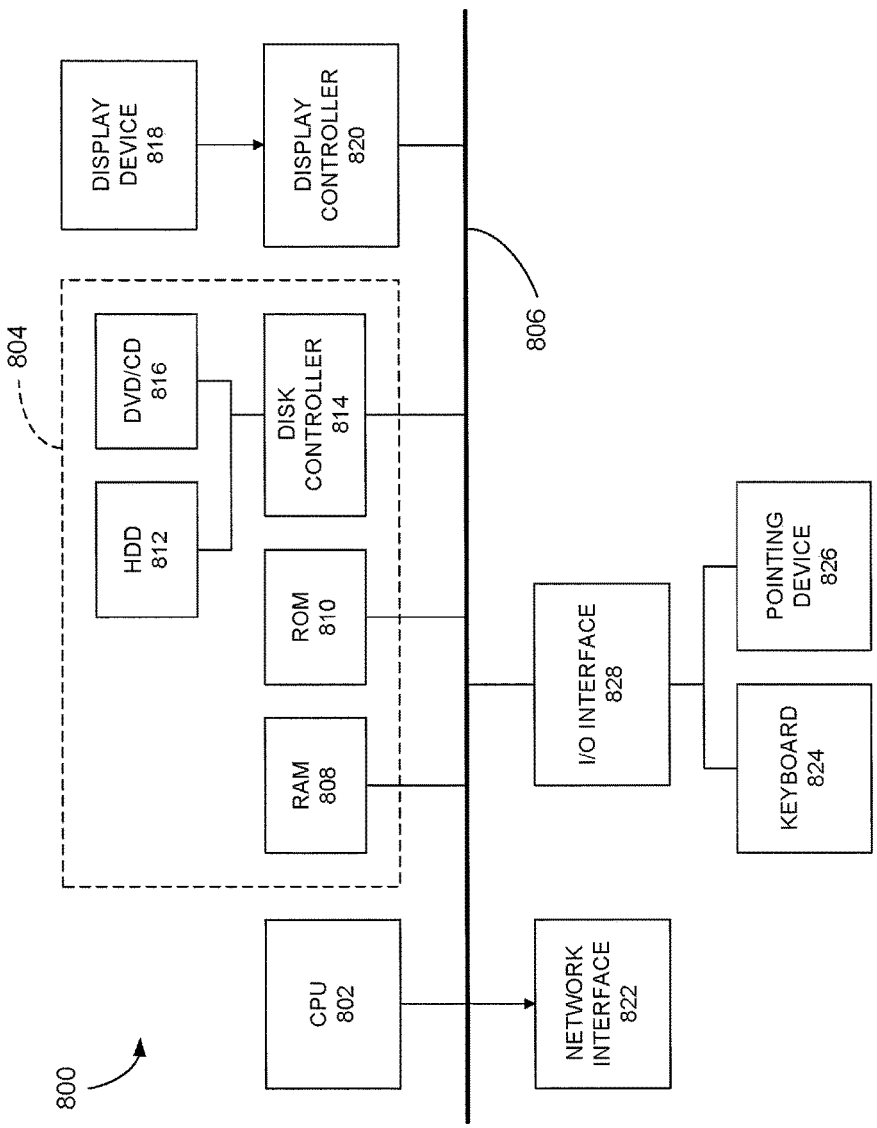
FIG. 8 is a schematic block diagram of an exemplary computer architecture for use with the computer system shown in FIG. 7.

FIG. 8 is a schematic block diagram of an exemplary computer architecture 800 for use with the server system 706, the administrator system 708, and/or the user system 710 (each shown in FIG. 7).

In an exemplary embodiment, the computer architecture 800 includes one or more processors 802 (CPU) that performs the processes described above and/or any additional processes that may be related to those described above. It should be understood that the term "processor" refers generally to any programmable system including systems and microcontrollers, reduced instruction set circuits (RISC), application-specific integrated circuits (ASIC), programmable logic circuits, and/or any other circuit or processor capable of executing the functions described herein. The above examples are exemplary only and, thus, are not intended to limit in any way the definition and/or meaning of the term "processor."

The steps of the processes described above and/or any additional processes that may be related to those described above may be stored as computer-executable instructions in, for example, a memory area 804 that is operably and/or communicatively coupled to the processor 802 by a system bus 806. A "memory area," as used herein, refers generally to any means of storing program code and instructions executable by one or more processors to aid in automatically aligning one or more secondary objects using an alignment tool. The memory area 804 may include one, or more than one, forms of memory. For example, the memory area 804 may include random-access memory (RAM) 808, which can include non-volatile RAM, magnetic RAM, ferroelectric RAM, and/or other forms of RAM. The memory area 804 may also include read-only memory (ROM) 810 and/or flash memory and/or electrically-programmable read-only memory (EEPROM). Any other suitable magnetic, optical, and/or semiconductor memory, such as a hard-disk drive (HDD) 812, by itself or in combination with other forms of memory, may be included in the memory area 804. HDD 812 may also be coupled to a disk controller 814 for use in transmitting and receiving messages to and from the processor 802. Moreover, the memory area 804 may also be, or may include, a detachable or removable memory 816, such as a suitable cartridge disk, CD-ROM, DVD, or USB memory. The above examples are exemplary only and, thus, are not intended to limit in any way the definition and/or meaning of the term "memory area."

The computer architecture 800 also includes a display device 818 that is coupled, such as operatively coupled, to a display controller 820. The display controller 820 receives data via the system bus 806 for display by the display device 818. The display device 818 may be, without limitation, a monitor, a television display, a plasma display, a liquid crystal display (LCD), a display based on light-emitting diodes (LED), a display based on organic LEDs (OLED), a display based on polymer LEDs, a display based on surface-conduction electron emitters, a display including a projected and/or reflected image, or any other suitable electronic device or display mechanism. Moreover, the display device 818 may include a touchscreen with an associated touchscreen controller. The above examples are exemplary only and, thus, are not intended to limit in any way the definition and/or meaning of the term "display device."

In addition, the computer architecture 800 includes a network interface 822 for use in communicating with a network (not shown in FIG. 8). Moreover, the computer architecture 800 includes one or more input devices, such as a keyboard 824 and/or a pointing device 826, such as a roller ball, mouse, touchpad, and the like. The input devices are coupled to and controlled by an input/output (I/O) interface 828, which is further coupled to the system bus 806.

A description of the general features and functionality of the display device 818, keyboard 824, pointing device 826, as well as the display controller 820, disk controller 814, network interface 822, and I/O interface 828 is omitted herein for brevity as these features are known.

Exemplary embodiments of methods, systems, apparatuses, and computer program products for use in FEA of 3D representations of physical objects are described above in detail. The methods, systems, apparatuses, and computer program products are not limited to the specific embodiments described herein but, rather, operations of the methods and/or computer program products and/or components of the system and/or apparatus may be utilized independently and separately from other operations and/or components described herein. Further, the described operations and/or components may also be defined in, or used in combination with, other systems, methods, and/or apparatus, and are not limited to practice with only the systems, methods, and storage media as described herein.

Client computers and servers, such as those described herein, includes at least one processor or processing unit and a system memory. The client computers and servers typically have at least some form of computer readable media. By way of example and not limitation, computer readable media include computer storage media and communication media. Computer storage media include volatile and non-volatile, removable and non-removable media implemented in any method or technology for storage of information such as computer readable instructions, data structures, program modules, or other data. Communication media typically embody computer readable instructions, data structures, program modules, or other data in a modulated data signal such as a carrier wave or other transport mechanism and include any information delivery media. Those skilled in the art are familiar with the modulated data signal, which has one or more of its characteristics set or changed in such a manner as to encode information in the signal. Combinations of any of the above are also included within the scope of computer readable media.

Exemplary computer-executable components for use the processes described above include, but are not limited to only including, a root substructure generation component that causes the server system 706 (shown in FIG. 7) or the processor 802 (shown in FIG. 8) to combine a plurality of retained degrees of freedom of a 3D representation to form a root substructure. The components also include a substructure generation component that causes the server system 706 or the processor 802 to reduce a structure of the 3D representation on to substructure modal subspaces and compute a plurality of eigenmodes, constraint modes, and condensed operators based on the reduced structure. Furthermore, the substructure generation component causes the server system 706 or the processor 802 to generate at least one substructure of the 3D representation based on the plurality of eigenmodes, constraint modes, and condensed operators.

In some embodiments, the components also include a matrix generation component that causes the server system 706 or the processor 802 to compute at least one of a stiffness matrix, a mass matrix, a damping matrix, and a force vector matrix. In such embodiments, the substructure generation component causes the server system 706 or the processor 802 to compute the reduced structure based at least in part on at least one of the stiffness matrix, the mass matrix, the damping matrix, and the force vector matrix.

In some embodiments, the substructure generation component also causes the server system 706 or the processor 802 to partition the structure into the at least one substructure, such that the at least one substructure includes a plurality of levels based at least in part on at least one of the stiffness matrix, the mass matrix, the damping matrix, and the force vector matrix.

In some embodiments, the substructure generation component also causes the server system 706 or the processor 802 to compute a reduced eigenproblem using the reduced structure.

Moreover, in some embodiments, the substructure generation component causes the server system 706 or the processor 802 to reduce the structure except for the root substructure. In other embodiments, the substructure generation component causes the server system 706 or the processor 802 to reduce the structure and the root substructure.

In some embodiments, the substructure generation component also causes the server system 706 or the processor 802 to compute a plurality of orthogonal modified dynamic modes.

Although the present invention is described in connection with an exemplary FEA simulation system environment, embodiments of the invention are operational with numerous other general purpose or special purpose simulation system environments or configurations. The simulation system environment is not intended to suggest any limitation as to the scope of use or functionality of any aspect of the invention. Moreover, the simulation system environment should not be interpreted as having any dependency or requirement relating to any one or combination of components illustrated in the exemplary operating environment. Examples of well known simulation systems, environments, and/or configurations that may be suitable for use with aspects of the invention include, but are not limited to, personal computers, server computers, hand-held or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the invention may be described in the general context of computer-executable instructions, such as program components or modules, executed by one or more computers or other devices. Aspects of the invention may be implemented with any number and organization of components or modules. For example, aspects of the invention are not limited to the specific computer-executable instructions or the specific components or modules illustrated in the figures and described herein. Alternative embodiments of the invention may include different computer-executable instructions or components having more or less functionality than illustrated and described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of aspects of the invention or embodiments thereof, the articles "a," "an," "the," and "said" are intended to mean that there are one or more of the elements. The terms "comprising," "including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computer-implemented method for modifying design of a physical object using finite element analysis simulation of a three-dimensional (3D) representation of the physical object, said computer-implemented method comprising:
   (i) using one or more processors, performing a finite element analysis simulation of the physical object, performing the finite element analysis simulation including embedding a process of user-defined substructure generation in an automated multilevel substructuring (AMLS) eigensolution process, the AMLS eigensolution process comprising:
      computing and storing a stiffness matrix based on physical properties of the physical object;
      combining a plurality of user-defined retained degrees of freedom of the 3D representation of the physical object to form a root substructure;
      reducing a structure of the 3D representation of the physical object on to a reduced AMLS subspace and augmenting the reduced structure of the AMLS subspace with the root substructure by making the root substructure a root of the reduced structure of the AMLS subspace, wherein the reduced structure, excluding the root substructure augmented thereon, is computed based at least in part on the stored stiffness matrix;
      computing, using an AMLS technique, a plurality of eigenmodes and condensed operators of a global substructure based on the reduced structure;
      computing a plurality of constraint modes of the global substructure using an AMLS transformation matrix, the user-defined retained degrees of freedom, and the computed and stored stiffness matrix, wherein computing the plurality of constraint modes reuses the computed and stored stiffness matrix;
      generating the global substructure of the 3D representation of the physical object in accordance with: (a) the plurality of eigenmodes and condensed operators being computed based on the reduced structure and (b) the plurality of constraint modes being computed reusing the stored stiffness matrix; and
      storing the generated global substructure in a memory area;
   (ii) completing the finite element analysis simulation of the physical object by the one or more processors accessing the stored global substructure from the memory area and performing the finite element analysis simulation of the physical object using the accessed global substructure, wherein the AMLS eigensolution process eliminates requirement of computing full substructure modes in the finite element analysis simulation of the physical object; and
   (iii) modifying the 3D representation of the physical object based on results of completing the finite element analysis simulation, thereby modifying the design of the physical object.

2. A computer-implemented method in accordance with claim 1, further comprising computing at least one of: a mass matrix, a damping matrix, and a force vector matrix, wherein the reduced structure, excluding the root substructure augmented thereon, is computed based at least in part on at least one of: the mass matrix, the damping matrix, and the force vector matrix.

3. A computer-implemented method in accordance with claim 2, wherein reducing a structure comprises partitioning the structure, excluding the root substructure augmented, into at least one substructure on a plurality of levels and based at least in part on at least one of the stiffness matrix, the mass matrix, the damping matrix, and the force vector matrix.

4. A computer-implemented method in accordance with claim 1, wherein computing a plurality of eigenmodes and condensed operators comprises computing a reduced eigenproblem using the reduced structure.

5. A computer-implemented method in accordance with claim 1 wherein the AMLS eigensolution process further comprises storing the plurality of eigenmodes, constraint modes, and condensed operators in the memory area.

6. A computer-implemented method in accordance with claim 1, wherein reducing a structure comprises reducing the structure except for the root substructure.

7. A computer-implemented method in accordance with claim 1, wherein reducing a structure comprises reducing the structure and the root substructure.

8. A computer-implemented method in accordance with claim 7, further comprising computing a plurality of orthogonal modified global dynamic modes on the AMLS subspace.

9. A computer-implemented method in accordance with claim 8, further comprising storing the plurality of orthogonal modified global dynamic modes in the memory area.

10. A computer for modifying design of a physical object using finite element analysis simulation of a three-dimensional (3D) representation of the physical object, said computer comprising:
    a memory area; and
    a processor operatively coupled to said memory area and configured to, perform a finite element analysis simulation of the physical object, performing the finite element analysis simulation including embedding a process of user defined substructure generation in an automated multilevel substructuring (AMLS) eigensolution process, the AMLS eigensolution process implemented by the processor configured to:
       compute and store a stiffness matrix based on physical properties of the physical object;
       combine a plurality of user-defined retained degrees of freedom of the 3D representation of the physical object to form a root substructure;
       reduce a structure of the 3D representation of the physical object on to a reduced AMLS subspace and augment the reduced structure of the AMLS subspace with the root substructure by making the root substructure a root of the reduced structure of the AMLS subspace, wherein the reduced structure, excluding the root substructure augmented thereon, is computed based at least in part on the stored stiffness matrix;

compute, using an AMLS technique, a plurality of eigenmodes and condensed operators of a global substructure based on the reduced structure;

compute a plurality of constraint modes of the global substructure using an AMLS transformation matrix, the user-defined retained degrees of freedom, and the computed and stored stiffness matrix, wherein computing the plurality of constraint modes reuses the computed and stored stiffness matrix;

generate the global substructure of the 3D representation of the physical object in accordance with: (a) the plurality of eigenmodes and condensed operators being computed based on the reduced structure and (b) the plurality of constraint modes being computed reusing the stored stiffness matrix; and store the generated global substructure in said memory area; and the processor further being configured to:

access the stored global substructure from said memory area and perform the finite element analysis simulation of the physical object using the accessed global substructure, wherein the AMLS eigensolution process eliminates requirement of computing full substructure modes in the finite element analysis simulation of the physical object: and modify the 3D representation of the physical object based on results of completing the finite element analysis simulation, thereby modifying the design of the physical object.

11. A computer in accordance with claim 10, wherein said processor is further configured to compute at least one of: a mass matrix, a damping matrix, and a force vector matrix, and wherein the reduced structure, excluding the root substructure augmented thereon, is computed based at least in part on at least one of: the mass matrix, the damping matrix, and the force vector matrix.

12. A computer in accordance with claim 11, wherein said processor is further configured to partition the structure of the 3D representation, excluding the root substructure augmented, into at least one substructure on a plurality of levels and based at least in part on at least one of the stiffness matrix, the mass matrix, the damping matrix, and the force vector matrix.

13. A computer in accordance with claim 10, wherein said processor is further configured to compute a reduced eigenproblem using the reduced structure.

14. A computer in accordance with claim 10, wherein said processor is further configured, as part of the AMLS eigensolution process, to store the plurality of eigenmodes, constraint modes, and condensed operators in said memory area.

15. A computer in accordance with claim 10, wherein said processor is further configured to reduce the structure except for the root substructure.

16. A computer in accordance with claim 10, wherein said processor is further configured to reduce the structure and the root substructure.

17. A computer in accordance with claim 16, wherein said processor is further configured to compute a plurality of orthogonal modified global dynamic modes on the AMLS subspace.

18. A computer in accordance with claim 17, wherein said processor is further configured to store the plurality of orthogonal modified global dynamic modes in said memory area.

19. A computer program product for modifying design of a physical object using finite element analysis simulation of a three-dimensional (3D) representation of the physical object, said computer program product comprising one or more non-transitory computer-readable storage media having computer-executable components, said components comprising:

an automated multilevel substructuring (AMLS) eigensolution component configured to, perform a finite element analysis simulation of the physical object, performing the finite element analysis simulation including embedding a process of user defined substructure generation in an AMLS eigensolution process, the AMLS eigensolution process implemented by components comprising:

a matrix generation component that when executed by at least one processor causes the at least one processor to compute and store a stiffness matrix based on physical properties of the physical object;

a root substructure generation component that when executed by at least one processor causes the at least one processor to combine a plurality of user-defined retained degrees of freedom of the 3D representation of the physical object to form a root substructure;

a substructure generation component that when executed by at least one processor causes the at least one processor to:

reduce a structure of the 3D representation of the physical object on to a reduced AMLS subspace and augment the reduced structure of the AMLS subspace with the root substructure by making the root substructure a root of the reduced structure of the AMLS subspace, wherein the reduced structure, excluding the root substructure augmented thereon, is computed based at least in part on the stored stiffness matrix;

compute, using an AMLS technique, a plurality of eigenmodes and condensed operators of a global substructure based on the reduced structure;

compute a plurality of constraint modes of the global substructure using an AMLS transformation matrix, the user-defined retained degrees of freedom, and the computed and stored stiffness matrix, wherein computing the plurality of constraint modes reuses the computed and stored stiffness matrix;

generate the global substructure of the 3D representation of the physical object in accordance with: (a) the plurality of eigenmodes and condensed operators being computed based on the reduced structure and (b) the plurality of constraint modes being computed reusing the stored stiffness matrix;

perform the finite element analysis simulation of the physical object using the generated global substructure such that requirement of computing full substructure modes is eliminated in the finite element analysis simulation of the physical object; and modify the 3D representation of the physical object based on results of completing the finite element analysis simulation, thereby modifying the design of the physical object.

20. A computer program product in accordance with claim 19, wherein said matrix generation component causes the at least one processor to compute at least one of: a mass matrix, a damping matrix, and a force vector matrix, and wherein said substructure generation component causes the at least one processor to compute the reduced structure, excluding the root substructure augmented thereon, based at least in part on at least one of: the mass matrix, the damping matrix, and the force vector matrix.

21. A computer program product in accordance with claim 20, wherein said substructure generation component further causes the at least one processor to partition the structure, excluding the root substructure augmented, into at least one substructure on a plurality of levels and based at least in part on at least one of the stiffness matrix, the mass matrix, the damping matrix, and the force vector matrix.

22. A computer program product in accordance with claim 19, wherein said substructure generation component further causes the at least one processor to compute a reduced eigenproblem using the reduced structure.

23. A computer program product in accordance with claim 19, wherein said substructure generation component further causes the at least one processor to reduce the structure except for the root substructure.

24. A computer program product in accordance with claim 19, wherein said substructure generation component further causes the at least one processor to reduce the structure and the root substructure.

25. A computer program product in accordance with claim 24, wherein said substructure generation component further causes the at least one processor to compute a plurality of orthogonal modified global dynamic modes on the AMLS subspace.

* * * * *